United States Patent [19]
Kanaishi

[11] Patent Number: 5,602,792
[45] Date of Patent: Feb. 11, 1997

[54] SEMICONDUCTOR DEVICE HAVING SUPPLY VOLTAGE CONVERTING CIRCUITS

[75] Inventor: Yoshikazu Kanaishi, Kanagawa, Japan

[73] Assignee: Sony Corporation, Tokyo, Japan

[21] Appl. No.: 678,146

[22] Filed: Apr. 1, 1991

[30] Foreign Application Priority Data

Mar. 30, 1990 [JP] Japan ................................. 2-83789

[51] Int. Cl.$^6$ .................................................. G11C 7/00
[52] U.S. Cl. ......................................... 365/226; 327/535
[58] Field of Search ........................... 365/226, 189.09, 365/189.11; 307/296.6, 296.8, 491, 497, 264, 303; 323/299, 226, 303

[56] References Cited

U.S. PATENT DOCUMENTS

| | | | |
|---|---|---|---|
| 4,482,985 | 11/1984 | Itoh | 365/226 |
| 4,585,955 | 4/1986 | Uchida | 365/226 |
| 4,683,382 | 7/1987 | Sakurai | 365/227 |
| 4,780,854 | 10/1988 | Watanabe | 307/296.8 |
| 4,964,084 | 10/1990 | Jung | 365/226 |
| 4,983,905 | 1/1991 | Sano | 323/303 |
| 5,021,728 | 6/1991 | Sato | 323/299 |
| 5,023,476 | 6/1991 | Watanabe | 307/296.6 |
| 5,046,052 | 9/1991 | Miyaji | 365/226 |
| 5,083,078 | 1/1992 | Kübler | 323/299 |
| 5,121,007 | 6/1992 | Aizaki | 365/226 |

Primary Examiner—A. Zarabian
Attorney, Agent, or Firm—Hill, Steadman & Simpson

[57] ABSTRACT

A semiconductor device of the present invention includes an internal circuit within the voltage is pulled down, and two voltage converting circuits for pulling down the external supply voltage. One of the voltage converting circuits supplies a pulled-down voltage to the internal circuit during the normal operation, while the other of the voltage converting circuits operates under a signal from a control circuit, which monitors the voltage level at an external terminal, so as to supply the voltage pulled down from the voltage at the external terminal to the internal circuit. A reliability test, such as burn-in, may be conducted by simply supplying a higher voltage to the external terminal.

5 Claims, 2 Drawing Sheets

5,602,792

SEMICONDUCTOR DEVICE HAVING SUPPLY VOLTAGE CONVERTING CIRCUITS

BACKGROUND OF THE INVENTION

1. Field of the Invention

This invention relates to a semiconductor device in which the power source voltage supplied at an external power supply terminal is converted by voltage converting circuits into a predetermined voltage which is to be supplied to an interval circuit. The semiconductor device may be used conveniently with a memory device having a high integration degree.

2. Description of the Prior Art

In a semiconductor integrated circuit device, such as an MOS type device, the tendency is towards smaller size and higher density. On the other hand, as the power source voltage supplied to the circuit device, the voltage having a usual voltage value is used in view of system interfacing and noise margin. If such usual voltage is employed, concentration of the electrical fields or implantation of hot carriers occur within the inside of the integrated circuit device to deteriorate the reliability of the circuit device. Thus it has been proposed to use a voltage which is pulled down from the power supply voltage within the circuit device.

Meanwhile, so-called burn-in is occasionally conducted on the semiconductor integrated circuit device, in which, for the purpose of screening rejects at the initial stage or testing for reliability of newly developed devices, the circuit device is operated under application of a voltage which is higher than the ordinary voltage. In connection with the above described semiconductor integrated circuit device in which the voltage is pulled down within the inside of the device, the following techniques have been known in which the circuit device may be operated positively even when an intentionally high power source voltage is applied thereto for, for example, burn-in testing.

FIG. 1 shows an example of a conventional semiconductor integrated circuit device described in Japanese Patent KOKAI (Laying-Open) Publication No. 63-181196 (1988). With the known circuit device, shown in FIG. 1, the voltage applied to an external power source terminal 3 is pulled down by a supply voltage converting circuit 2 and the thus pulled-down voltage is supplied to an internal circuit 1. The external voltage is directly supplied to an input converting circuit 5 and an output converting circuit 6. When a control signal is supplied from outside to a switching control input terminal 4, a voltage higher than the pulled-down voltage is supplied to the internal circuit 1 to permit reliability tests to be conducted on the circuit device.

However, with the semiconductor integrated circuit device, as shown in FIG. 1, the switching control input terminal 4, which is an extra output terminal, need to be provided in order to carry out the reliability tests. It is however difficult with a complicated multi-function device having a higher integration degree to provide such an extra dedicated external terminal.

FIG. 2 shows another example of a conventional semiconductor circuit device as disclosed in the Japanese Patent Kokai (Laying-Open) Publication No.62-232155 (1987). With the present circuit device, shown in FIG. 2, the voltage supplied to an external power supply terminal 13 is pulled down by a supply voltage converting circuit 12, and the thus pulled-down voltage is supplied to an internal circuit 11. The supply voltage is also supplied directly to an input converting circuit 16 and an output converting circuit 17. During burn-in, a control circuit 14 is activated by a special trigger signal supplied to terminal 13 to fire a MOS transistor 15. As a result, the voltage supplied to terminal 13 is directly supplied to the internal circuit 11 to permit reliability tests, for example, to be conducted on the circuit device.

However, with the semiconductor device, shown in FIG. 2, the external power source terminal 13 need to be supplied with the special trigger signal in order to carry out the reliability tests on the circuit device. In addition, on switching the circuit device, the voltage supplied to the external power source terminal 13 is directly supplied to the internal circuit 11. However, a problem is presented in this case because the supply voltage itself is a sufficiently high voltage. Although a voltage which is not too high so as to be suited to the internal circuit 11 may be supplied during the reliability tests to the external power source terminal 13 in order to avoid an excessively high voltage, the supply voltage would be too low for the input converting circuit 16 or the output converting circuit 17.

SUMMARY OF THE INVENTION

An object of the present invention is to provide a semiconductor device on which a reliability test, such as a burn-in, may be conducted without necessitating special switching control input terminals or special trigger signals.

Another object of the present invention is to provide a semiconductor device in which a moderate voltage may be supplied to the internal circuit and to the input and output converting circuits even during the reliability tests, such as the burn-in tests.

The semiconductor device of the present invention has an internal circuit, to which the power source voltage supplied at the external power supply terminal is applied by means of a first supply voltage converting circuit. The internal circuit is formed as a memory cell array, by way of an example, and an internal voltage pull-down is performed in the supply voltage control circuit. When conducting a reliability test, such as burn-in, a voltage higher than the ordinary power source voltage is supplied at the external power supply terminal. This high voltage is sensed by a control circuit and a second supply voltage converting circuit is activated responsive to the output signal from the control circuit. The second supply voltage converting circuit transmits a voltage which is moderately adjusted from the high voltage to the internal circuit.

DETAILED DESCRIPTION OF THE PREFERRED EMBODIMENT

Figure 1:
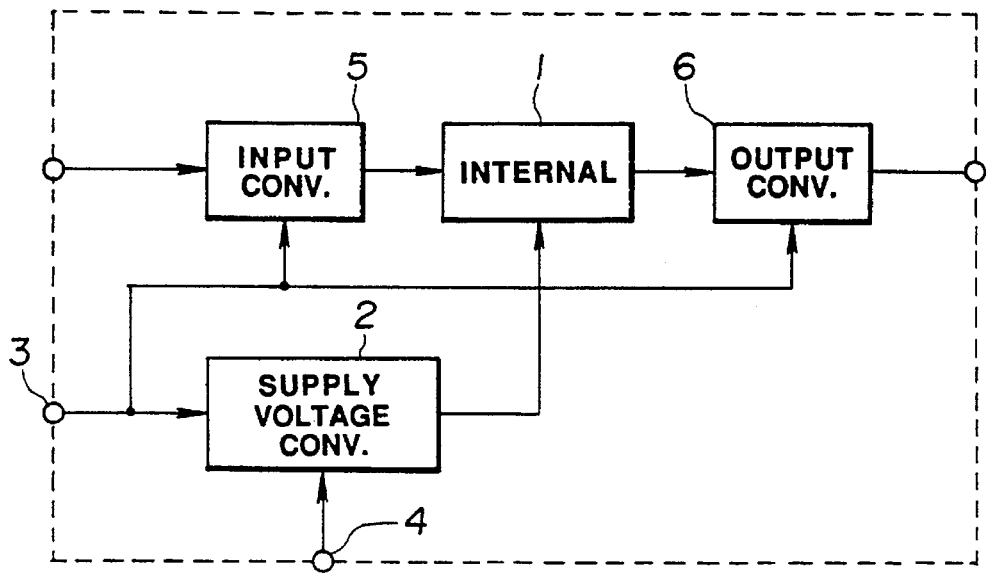
FIG. 1 is a block diagram showing an example of a conventional semiconductor device.
Figure 2:
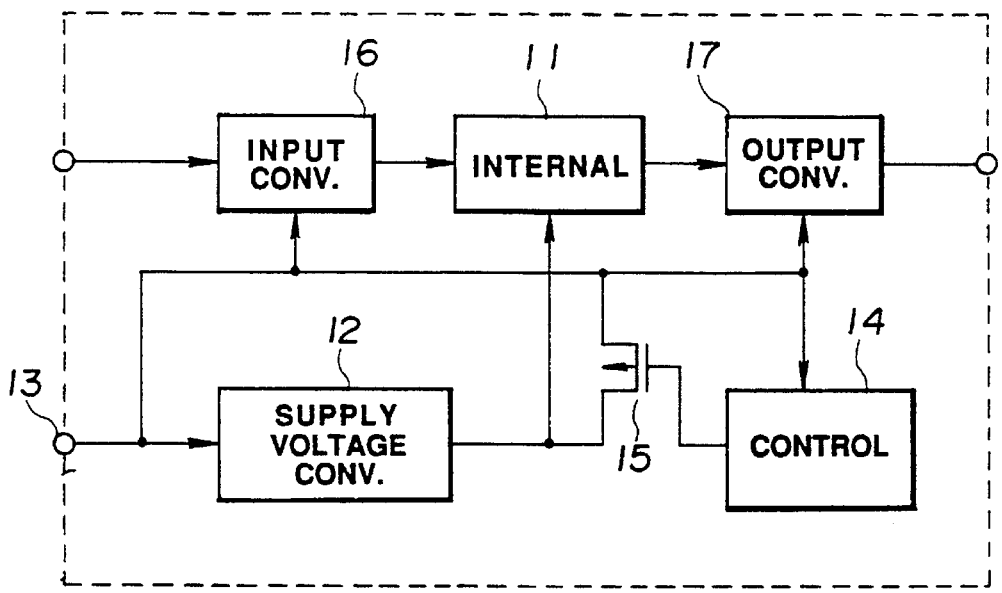
FIG. 2 is a block diagram showing another example of a conventional semiconductor device.
Figure 3:
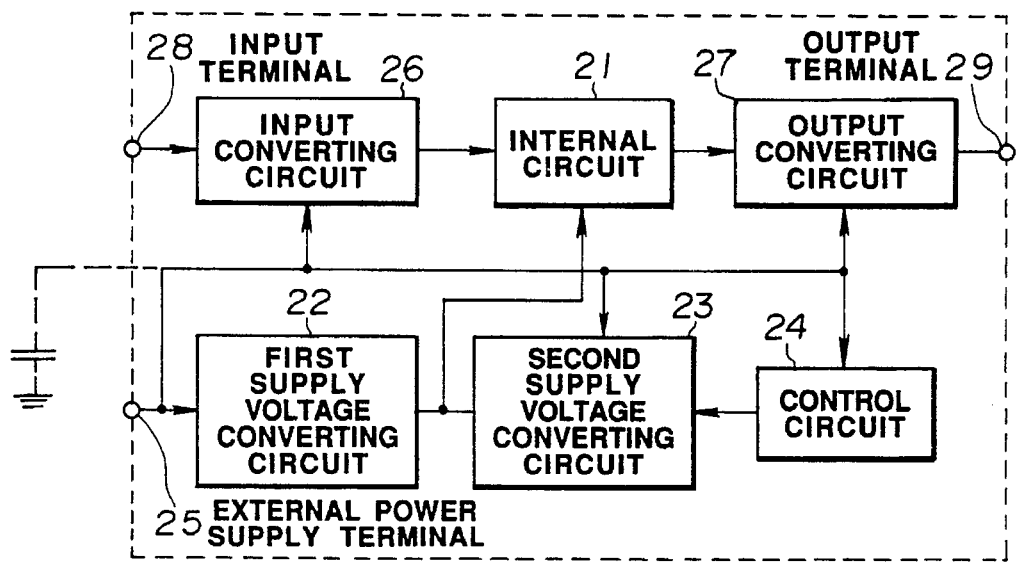
FIG. 3 is a block diagram showing an embodiment of the semiconductor device according to the present invention.
Figure 4:
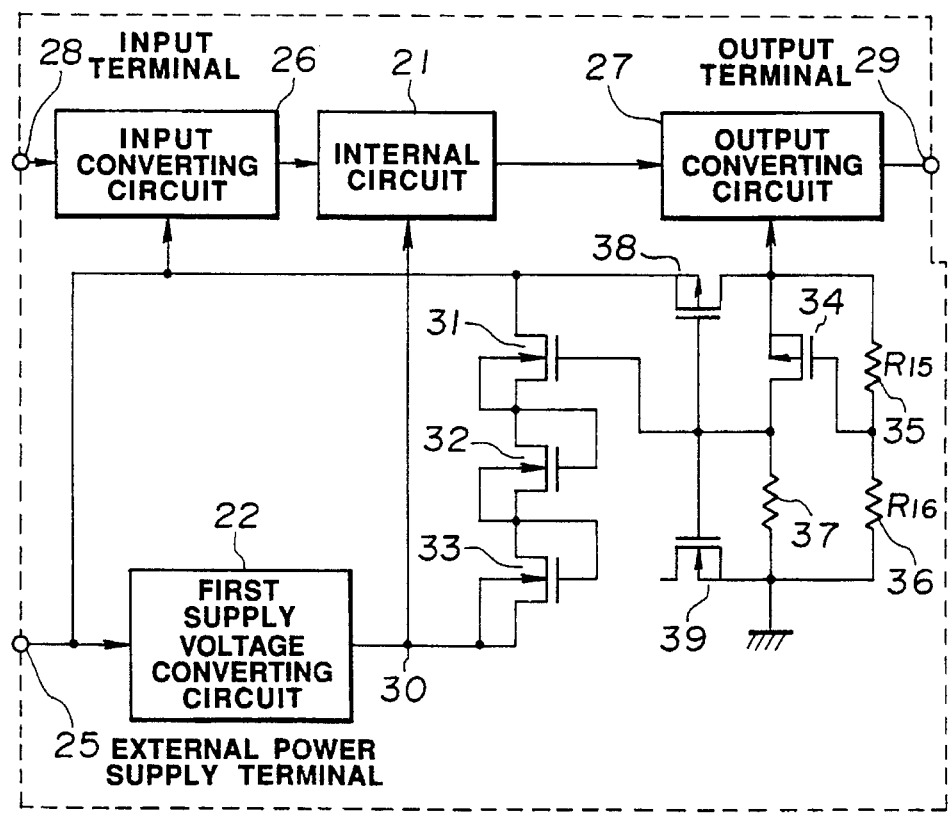
FIG. 4 illustrates detailed circuitry for the second supply voltage converting circuit and the control circuit employed in the semiconductor device shown in FIG. 3.

By referring to the accompanying drawings, an illustrative embodiment of the present invention will be explained in detail. FIG. 3 is a block diagram showing a semiconductor integrated circuit device according to the present embodiment and FIG. 4 is a circuit diagram similar to FIG. 3 and showing a portion of the circuit device shown in FIG. 3 in more detail.

Referring first to FIG. 3, the semiconductor circuit device of the present embodiment includes an internal circuit 21 which, when the circuit device is a random access memory (RAM), for example, is constituted by an array of memory cells, an address decoder and a sense amplifier. When the circuit device is a high resistance load type SRAM, a resistance load is provided within the internal circuit 21. On the input and output sides of the internal circuit 21, an input converting circuit 26 and an output converting circuit 27 are provided, respectively. The input converting circuit 26 is adapted for converting the logical signal level difference of the input signal at the input terminal 28 into the logical signal level difference for the internal circuit 21. The output converting circuit 27 is adapted for converting the output signal from the internal circuit 21 into the logical signal level difference for the external signal and the output signal thus converted by the output converting circuit is taken out at an output terminal 29.

The first supply voltage converting circuit 22 is adapted for receiving a predetermined power source voltage Vcc from the external power source terminal 25 and converting the voltage Vcc into a predetermined lower voltage which is to be transmitted to the internal circuit 21. In this manner, MOS transistors in the internal circuit 21 is subject to lesser electrical field concentration. A control circuit 24 for monitoring the voltage at the external power source terminal 29 is also connected to the external power source terminal 25. The control circuit 24 senses the voltage supplied at the external power source terminal 25 and, when the voltage higher than the predetermined power source voltage Vcc is supplied at the external power source terminal 29, generates a signal for activating a second supply voltage converting circuit, 23. By sensing the voltage at the external power source terminal 29 in this manner, it, becomes unnecessary to provide a special trigger signal or to use a switching signal input, terminal. The second supply voltage converting circuit 23 is activated when a voltage higher than the predetermined power source voltage Vcc is supplied to the external power source terminal 25 so as to pull down the high voltage and to supply the thus pulled-down voltage to the internal circuit 21. The voltage supplied at this time to the internal circuit 21 is the voltage supplied to terminal 25 less a predetermined voltage and, if the voltage supplied at the external power source terminal 25 becomes higher, the voltage supplied to the internal circuit 21 is correspondingly increased. Conversely, if the voltage supplied at the external power source terminal 25 becomes lower, the voltage supplied to the internal circuit, 21 is correspondingly decreased. In this manner, a desired voltage may be supplied to the internal circuit 21 for conducting reliability tests, In FIG. 4, the integrated semiconductor circuit device of the present embodiment is shown in more detail. The above mentioned second supply voltage converting circuit 23 is constituted by three pMOS transistors 31, 32 and 33. The control circuit 24 is constituted by pMOS transistors 34 and 38, an nMOS transistor 39 and resistors 35, 36 and 37.

The three nMOS transistors 31, 32 and 33 of the second supply voltage converting circuit 23 are connected in series between the external power supply terminal 25 and a junction or node 30 connecting to the internal circuit 21. Thus the nMOS transistor 31 has its drain connected to the external power supply terminal 25, the nMOS transistor 31 has its source connected to the drain of the nMOS transistor 32, the nMOS transistor 32 has its source connected to the drain of the nMOS transistor 33 and the nMOS transistor 33 has its source connected to the node 30. The gate of the nMOS transistor 31 is connected to the drain of the pMOS transistor 34 of the control circuit 24, such that the nMOS transistor 31 functions not only as a voltage pull-down diode but also as a switch. The gates of the nMOS transistors 32 and 33 are connected back to the drains thereof, so that these nMOS transistors 32 and 33 are used as voltage pull-down diodes.

Turning to the construction of the control circuit 24, the pMOS transistor 34 has its source connected to the external power supply terminal 25, while having its drain connected to one end of the resistor 37, to the other end of which a grounding voltage GND is supplied. The pMOS transistor 34 has its gate connected to the junction between resistors 35 and 36 which are connected in series between the external power supply terminal 25 and the grounding line. The signal for activating the second supply voltage converting circuit 23 is taken out at the drain of the pMOS transistor 34. This signal is supplied to the gate of the nMOS transistor 31 for on-off control thereof. To the drain of the pMOS transistor 34, from which the signal is taken out there are also connected the gates of the pMOS transistor 38 and the nMOS transistors 39 both functioning as the node-stabilizing capacitance. Malfunction due to, for example, power source voltage spikes, may be effectively prevented by these MOS transistors 38 and 39.

Turning to the operation of the control circuit 24, when a voltage higher than the ordinary power supply voltage Vcc is supplied at the external power supply terminal 25, the pMOS transistor 34 is turned on to produce an output signal. The condition under which the pMOS transistor 34 is turned on is determined by the resistance ratio R16/R15 of the resistors 36 and 35 and by the threshold voltage Vth(p) of the pMOS transistor 34. For example, if the resistance ratio R16/R15 of the resistors 36 and 35 is 6.5 and the threshold voltage V(th)(p) of the pMOS transistor 34 is −0.8 (V), the supply voltage $V_{EX}$ to the external power supply terminal 25 which will turn on the pMOS transistor 34 is such as is given by $$V_{EX} \geq -Vth(p) \times (1+R16/R15) \geq 0.8 \times 7.5 = 6(V)$$

Thus, when a voltage not less than 6 V is supplied at the external power supply terminal, the pMOS transistor 34 is turned on, so that the source-drain passage of the pMOS transistor 34 to the grounding line is rendered conductive to produce an output signal. This output signal is applied to the gate of the nMOS transistor 31 to fire the nMOS transistor 31 to activate the second supply voltage converting circuit 23.

While the second supply power converting circuit 23 is activated in this manner by the turning on of the nMOS transistor 31, the voltage $V_{INT}$ supplied to the internal circuit 21 is the voltage $V_{EX}$ at the external power supply terminal 25 less the threshold voltages Vth(n) of the three nMOS transistors 31 to 33. If, for example, the threshold voltage Vth(n) of each of the MOS transistors 31 to 33 is 0.8 V, and the voltage $V_{EX}$ at the external power supply terminal 25 is 7 V, the voltage $V_{INT}$ supplied to the internal circuit 21 is given by $$V_{INT} = V_{EX} - 3Vth(n) = 7 - 3 \times 0.8 = 4.6V$$

In this manner, in the semiconductor integrated circuit device of the present invention, the voltage $V_{INT}$ dependent on the voltage $V_{EX}$ at the external power supply terminal 29 may be supplied to the internal circuit 21 to permit effective reliability tests to be conducted on the circuit device at the desired burn-in voltage.

With the above described circuit device of the present invention, the voltage at the external power supply terminal 29 is monitored by the control circuit 24, such that the second supply voltage converting circuit 23 is activated in accordance with the thus monitored supply voltage. In this manner, the special trigger signal or the switching signal input terminal may be eliminated. On the other hand, since the voltage supplied to the internal circuit 21 is the voltage $V_{EX}$ at the external power supply terminal 25 which is pulled down by the second supply voltage converting circuit 23, the voltage of the desired value may be supplied to the internal circuit 21.

If the semiconductor integrated circuit device of the present invention is the high resistance load type static RAM, the resistors 35, 36 and 37 shown in FIG. 4 may be formed easily on a substrate. By using the resistors 35 to 37 having high resistance values, current consumption may be reduced, while the effects on the standly current may also be minimized.

It is to be noted that various changes may be made in the above described embodiment. For example, various changes in circuitry, such as changing the pulled down voltage or providing a changeover switch between the first supply voltage converting circuit 22 and the second supply voltage converting circuit 23, may be made without departing from the scope of the invention.

What is claimed is:

1. A semiconductor device, comprising:

an internal circuit which is activated on being supplied with a voltage, an external power supply terminal supplied with a power source voltage from outside, a first supply voltage converting circuit which, when the power source voltage supplied to said external power supply terminal is an ordinary voltage, causes said power source voltage to be modified to supply the thus modified voltage to said internal circuit, a control circuit for sensing the voltage at said external power source terminal and generating an output signal at an output terminal when a voltage higher than said ordinary voltage is supplied at said external power supply terminal, and a second supply power converting circuit activated responsive to said output signal from said control circuit to supply a voltage pulled down from the voltage at said external power supply terminal to said internal circuit, wherein said second supply voltage converting circuit includes a switch having one end connected to said external power supply terminal, and a level shifting circuit connected to the other end of said switch.

2. A semiconductor device according to claim 1, wherein said switch is a MOS transistor to the gate of which is supplied the output signal from said control circuit.

3. A semiconductor device according to claim 2, wherein the level shifting circuit is constituted by MOS transistors connected as diodes.

4. A semiconductor device, comprising:

an internal circuit which is activated on being supplied with a voltage, an external power supply terminal supplied with a power source voltage from outside, a first supply voltage converting circuit which, when the power source voltage supplied to said external power supply terminal is an ordinary voltage, causes said power source voltage to be modified to supply the thus modified voltage to said internal circuit, a control circuit for sensing the voltage at said external power source terminal and generating an output signal at an output terminal when a voltage higher than said ordinary voltage is supplied at said external power supply terminal, a second supply power converting circuit activated responsive to said output signal from said control circuit to supply a voltage pulled down from the voltage at said external power supply terminal to said internal circuit, wherein the output terminal of said control circuit has a capacitance between the external power supply terminal and the ground.

5. A semiconductor device, comprising:

an internal circuit which is activated on being supplied with a voltage, an external power supply terminal supplied with a power source voltage from outside, a first supply voltage converting circuit which, when the power source voltage supplied to said external power supply terminal is an ordinary voltage, causes said power source voltage to be modified to supply the thus modified voltage to said internal circuit, a control circuit for sensing the voltage at said external power source terminal and generating an output signal at an output terminal when a voltage higher than said ordinary voltage is supplied at said external power supply terminal, a second supply power converting circuit activated responsive to said output signal from said control circuit to supply a voltage pulled down from the voltage at said external power supply terminal to said internal circuit, wherein said internal circuit includes a memory cell array constituted by a plurality of memory cells, wherein said memory cells are SRAM memory cells, wherein said SRAM memory cells are of the high resistance load type and wherein said control circuit includes divider being connected to said external power supply terminal, and the output of said voltage divider being connected to the input of said inverter.

\* \* \* \* \*